(12) United States Patent
Starikov et al.

(10) Patent No.: US 7,289,198 B2
(45) Date of Patent: *Oct. 30, 2007

(54) PROCESS COMPENSATION FOR STEP AND SCAN LITHOGRAPHY

(75) Inventors: Alexander Starikov, Palo Alto, CA (US); Theodore Doros, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 221 days.

This patent is subject to a terminal disclaimer.

(21) Appl. No.: 10/989,684

(22) Filed: Nov. 15, 2004

(65) Prior Publication Data

US 2005/0094132 A1    May 5, 2005

Related U.S. Application Data

(63) Continuation-in-part of application No. 10/338,790, filed on Jan. 7, 2003, now Pat. No. 7,006,208.

(51) Int. Cl.
*G01J 1/00*    (2006.01)

(52) U.S. Cl. .................................................... 356/123
(58) Field of Classification Search ................. 356/123
See application file for complete search history.

(56) References Cited

U.S. PATENT DOCUMENTS

| 6,761,362 B2 | 7/2004 | Noguchi |
| 2003/0086081 A1 * | 5/2003 | Lehman .................... 356/237.1 |

OTHER PUBLICATIONS

"The Development of Step and Scan," Lithography Resource, Henley PUblishing Ltd., printed Sep. 7, 2004, 5 pgs.

* cited by examiner

*Primary Examiner*—Roy M. Punnoose
(74) *Attorney, Agent, or Firm*—Schwabe, Williamson & Wyatt, P.C.

(57) ABSTRACT

A method of process variation compensation in step-and-scan lithography which comprises estimating a magnitude of a process error over a full imaged substrate surface and applying error correction during scan exposure over the full imaged substrate surface is provided in the disclosed embodiments.

12 Claims, 5 Drawing Sheets

| Shot number in product file | Shot X; mm | Shot/slot Y; mm (notch down; wafer center is 0;0) | Slot ΔZ; μm | Slot θ; ppm |
|---|---|---|---|---|
| 60 | 80.32 | -60.0 | 0.002 | -0.2 |
| 60 | 80.32 | -60.5 | 0.002 | -0.2 |
| 60 | 80.32 | -61.0 | 0.003 | -0.1 |
| 60 | 80.32 | -61.5 | 0.004 | -0.0 |
| 60 | 80.32 | ... | ... | ... |

FIG. 4

| Shot number in product file | Shot X; mm | Shot/slot Y; (notch down); mm | Slot ΔZ; μm | Slot θ; ppm |
|---|---|---|---|---|
| 60 | 80.32 | -60.0 | -0.002 | 0.2 |
| 60 | 80.32 | -60.5 | -0.002 | 0.2 |
| 60 | 80.32 | -61.0 | -0.003 | 0.1 |
| 60 | 80.32 | -61.5 | -0.004 | 0.0 |
| 60 | 80.32 | ... | ... | ... |

FIG. 5

PROCESS COMPENSATION FOR STEP AND SCAN LITHOGRAPHY

CROSS REFERENCE TO RELATED APPLICATIONS

This is a continuation-in-part of application Ser. No. 10/338,790, filed Jan. 7, 2003, now U.S. Pat. No. 7,006,208.

FIELD OF THE INVENTION

The present invention relates to lithography, and more particularly, to process control in lithography.

BACKGROUND OF INVENTION

An integrated circuit (IC) is an interconnected network of microcircuits which form discrete IC devices. A microelectronic die comprises a die substrate upon which microcircuits are formed. The die substrates are diced from semi-conductor material, examples of which include, among others, wafers of silicon (Si), gallium arsenide (GaAs), Indium Phosphate (InP) and their derivations. Various techniques are used, such as layering, masking, doping, and etching, to build thousands and even millions of microscopic IC devices in the form of transistors, resistors, and others on the wafer. The IC devices are interconnected within individual dice to define a specific electronic circuit that performs a specific function, such as the function of a microprocessor or a computer memory.

Optical micro-lithography is a process used to produce ultra-high resolution features on the wafer. One type of optical micro-lithographic system is known as step and scan. The step and scan system comprises three primary subsystems: a laser subsystem to provide the radiation source; beam focusing and scanning subsystem that shapes and guides the radiation; and a wafer subsystem in which the wafer is held and positioned at the focus of the radiation. Micro-lithography systems must overcome a multitude of challenges to produce an image that is suitable for resolving 65 nanometer features and below.

The challenges of providing error-free lithographic projection can be addressed at the subsystem level. The laser subsystem must provide, among other things, a radiation beam at a predefined wavelength and uniformity of power. Laser subsystem errors develop where the wavelength and/or power of the radiation drifts from nominal.

The beam focusing and scanning subsystem must process, focus and direct the radiation in order to illuminate predetermined areas of the wafer. This subsystem comprises lenses, filters, mirrors, and positioning mechanisms that can contribute to errors. Errors occur at the lenses due to issues of alignment, astigmatism, as well as compaction and absorption that can vary over time.

The wafer subsystem comprises a wafer stage that positions the wafer during scanning. At the wafer stage, errors are introduced due to wafer handling, including issues related to the wafer chuck flatness, alignment, conveyance, positioning, and control systems. The positioning mechanisms have issues related to mechanical devices, such as wear, inertia, and vibration. The control systems must provide suitable algorithms for numerical control of the positioning actuators, with feedback control for dynamic correction. At the reticle stage, the illumination is shaped by passing the radiation through an illumination slit or slot to illuminate the desired scan field.

Step and scan refers to the process in which the wafer is imaged. The reticle comprises a substrate with variable transmission properties that projects a rectangular exposure onto the wafer surface. The rectangular exposure is scanned across the surface of the wafer in multiple, predefined fields. The scanned field is also rectangular. Issues related to the quality of the illumination at the surface of the wafer are compounded by all the potential error issues of the individual subsystems, which can produce a scanned field that has issues of static and dynamic distortion, image plane deviations, and overlay.

Another important factor related to potential errors in the step and scan system include wafer quality. At the resolution level, wafer planarity is a crucial factor in image focus on a wafer surface. Control for real-time focusing is required to follow the terrain of the wafer. The focus is controlled by sampling a finite number of areas as the wafer is scanned. Servo controlled wafer stages adjust the position of the wafer to keep the wafer's surface at the optimum lithographic focal point.

Additional sources of focus error as a result of wafer quality include: vendor-specific wafer bevel and systematic non-parallelism; layer- and process-specific wafer thickness variation, such as interlayer dielectric (ILD) deposition and chemical and mechanical planarization (CMP) variations.

Focus error can also be caused by focus sensors and focus software interacting with machine variables. The errors of conventional metrologies and monitors of focus and tilt can also cause focus error, and in particular, where these errors are not the same during test and during production exposure.

These error issues accumulate at the exposure location, and therefore the errors must be tightly budgeted. In order to minimize errors characteristic in step and scan systems, the subsystems are held to the tightest of tolerance achievable, which dramatically increases the cost of the system. In-line monitoring is used but is limited by sampling rate and damage assessment/mitigation.

Because a wafer stage will be moved on a trajectory unique by the layer being patterned and product because of different stepping and sizing of fields, the control system needs to place the wafer stage in exactly in the correct position. In the absence of infinite forces available to do so, there will be deviations from that desired position in step and scan.

Methods are needed to control characteristic defocus inherent in the step and scan systems. As IC device resolution is made even smaller, negating these error issues becomes critical.

BRIEF DESCRIPTION OF DRAWINGS

Embodiments of the present invention will be described by way of exemplary embodiments, but not limitations, illustrated in the accompanying drawings in which like references denote similar elements, and in which:

FIG. 4 is an example showing measured focus errors for a particular layer, in accordance with an embodiment of a method of the present invention; and FIG. 5 is a focus compensation file derived from the measured errors of FIG. 4, in accordance with one embodiment.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

In an embodiment in accordance with the present invention, methods for detection and subsequent correction of focus and tilt variations that occur during a specific product layer exposure is by focus and tilt pre-compensation during wafer exposure. The methods provide for correction over the entire exposed wafer surface. The methods do not depend on the correction of focus errors at each component of the system or wafer, but that the total focus error is measured and is then compensated at the time of use (e.g. during imaging).

Figure 1:
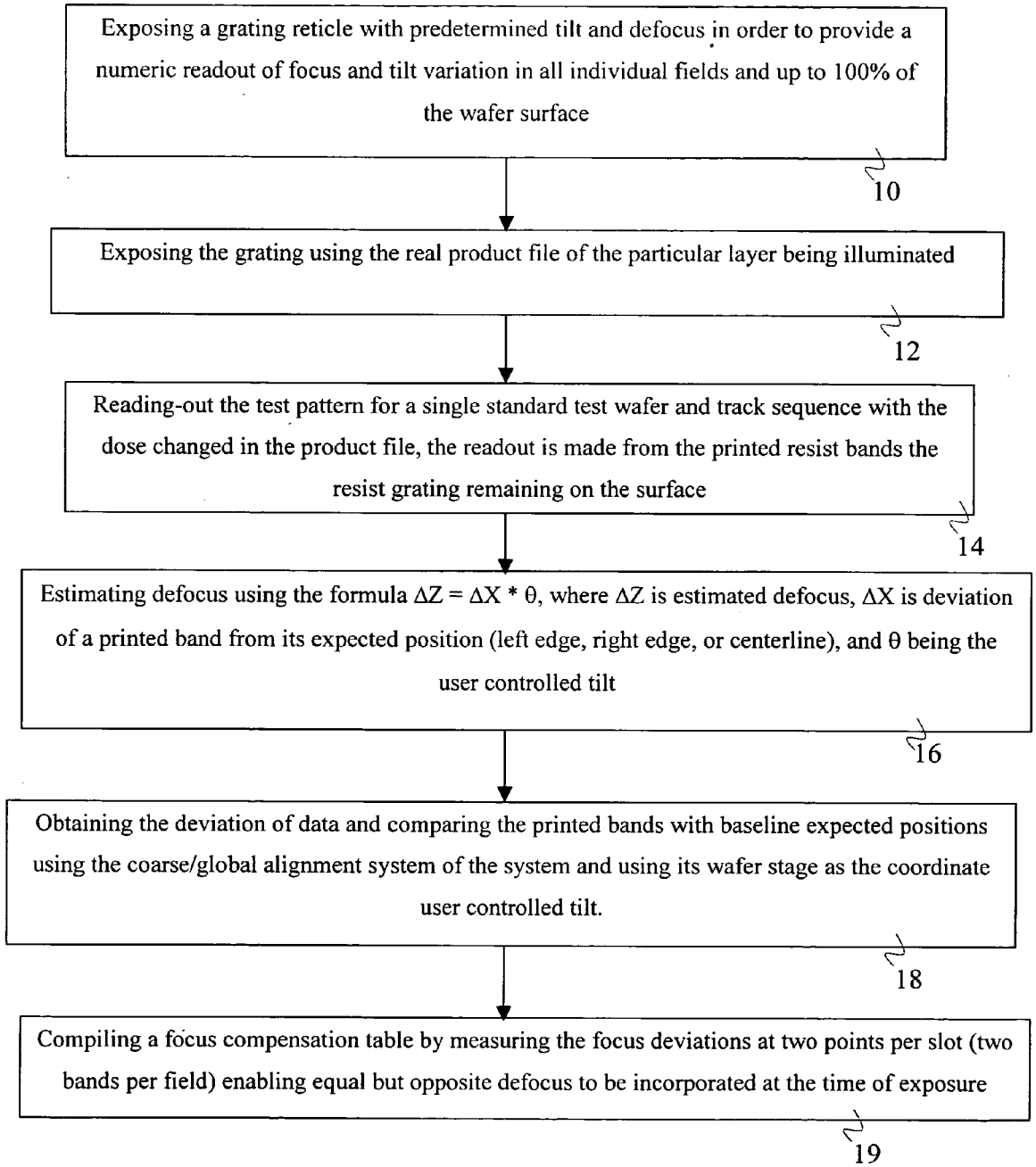
FIG. 1 is a flow diagram of a method, in accordance with an embodiment of the present invention, for pre-compensation of focus and tilt.

FIG. 1 is a flow diagram of a method, in accordance with an embodiment of the present invention, for pre-compensation of focus and tilt, comprising: exposing a grating reticle with predetermined tilt and defocus in order to provide a numeric readout of focus and tilt variation in all individual fields and up to 100% of the wafer surface 10; exposing the grating using the real product file of the particular layer being illuminated 12; reading-out the test pattern for a single standard test wafer and track sequence with the dose changed in the product file the readout made from the printed resist bands the resist grating remaining on the surface 14; estimating defocus using the formula $\Delta Z = \Delta X \ast \theta$, where $\Delta Z$ is estimated defocus, $\Delta X$ is deviation of a printed band from its expected position (left edge, right edge, or centerline), and $\theta$ being the user defined tilt 16; obtaining the deviation of data and comparing the printed bands with baseline expected positions using, as convenient, standalone or built-in automated wafer inspection or wafer metrology; and compiling a focus compensation table by measuring the focus deviations at two points per slot (two bands per field) enabling equal but opposite defocus to be incorporated at the time of exposure 19.

In another embodiment of the method for dynamic pre-compensation of focus and tilt, in accordance with the present invention comprises: estimating the correction over a full wafer surface (all scan fields); applying the correction over the same wafer surfaces; and obtaining the read-out of the focus error and its compensation made on the congruent domains, that is, the same number of degrees of freedom compensating for all error issues in the system.

Figure 2:
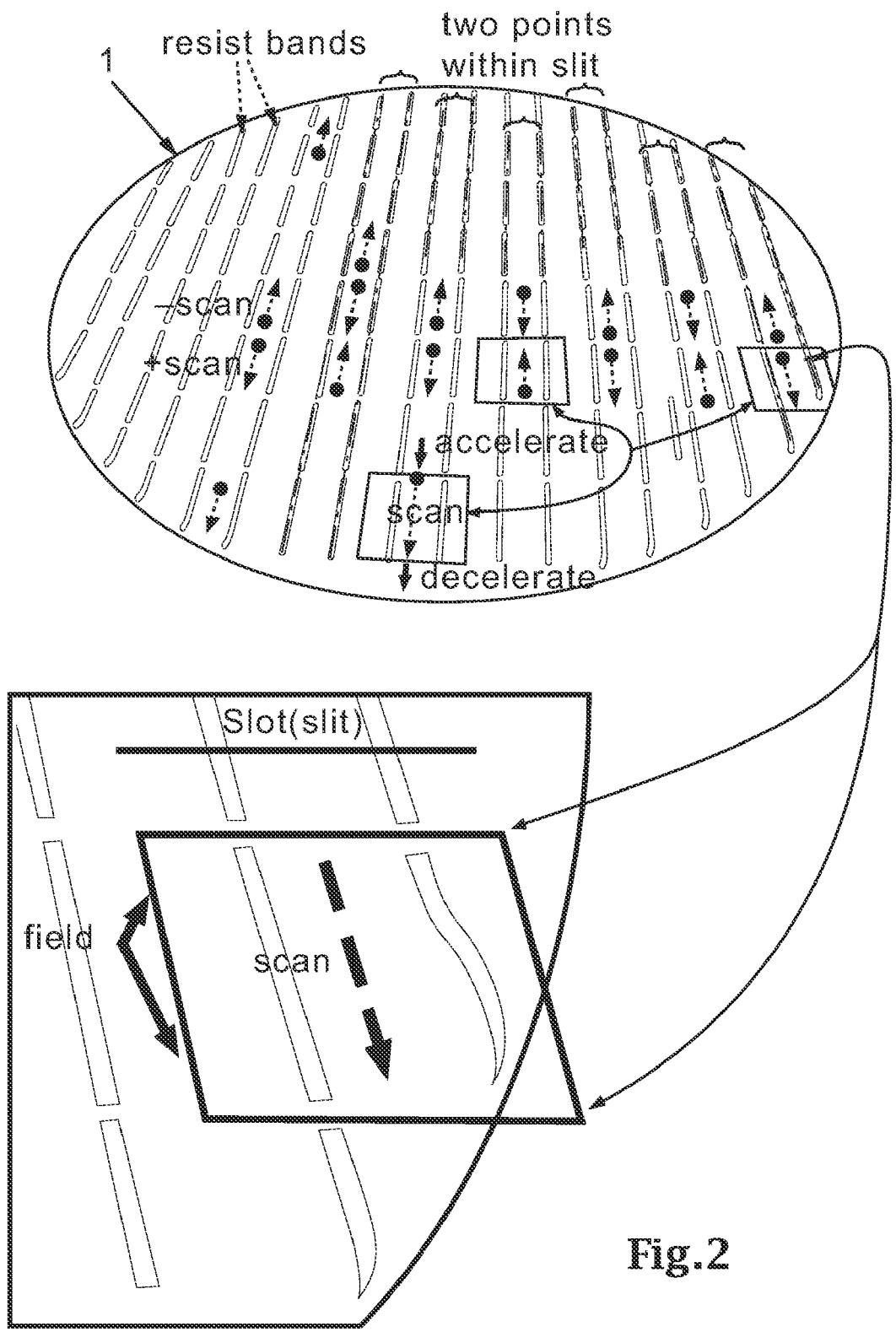
FIG. 2 is a view of a wafer, exposed to measure focus error, mapped into fields.
Figure 3:
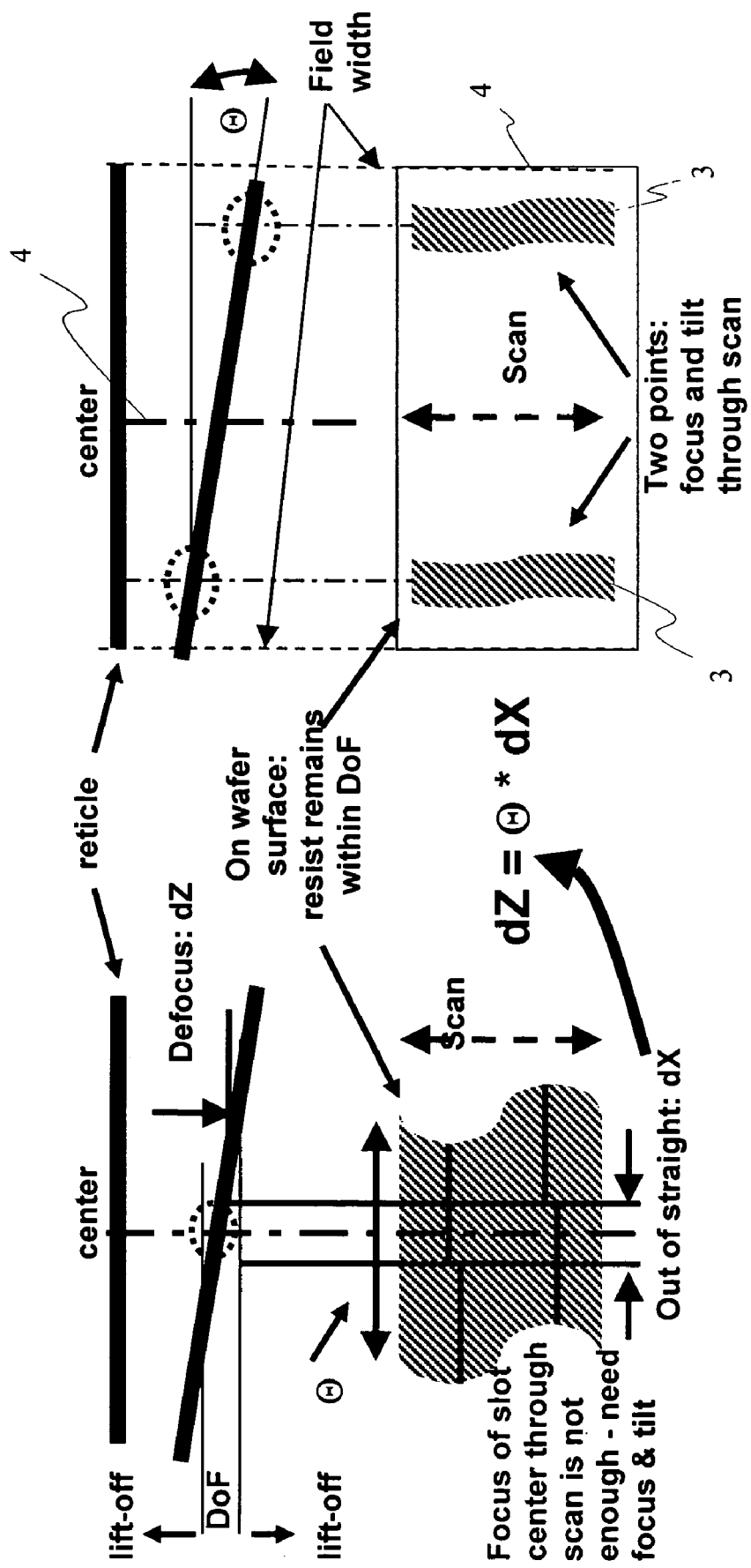
FIG. 3 represents a scan comprising two data collection paths across a field, in accordance with an embodiment of a method of the present invention.

FIG. 2 is a view of a wafer 1, exposed as required, mapped into fields 2; the fields 2 being referenced above, in accordance with an embodiment of a method of the present invention, with expanded view of one defocused and tilted field. FIG. 3 represents a scan comprising two data collection paths 3 across a field 2, in accordance with an embodiment of a method of the present invention. FIG. 3 also represents the focus error detected in paths 3 as an out-of-straight deviation from the error-free condition represented by the vertical dotted line 4, in accordance with an embodiment of a method of the present invention.

Two spaced apart paths 3 provide both defocus and tilt measurements. The data is fitted, using least squares or MAX/MIN error, to a "plane"; that is, to straight equidistant lines, the deviation from "plane" is computed as error from a set of straight equidistant lines. Lateral displacements of each band into focus error is converted using the formula $$\Delta Z = \Delta X \ast \theta$$

and represented as a line chart of defocus $\Delta Z$ along direction of scan.

An example calculation for a typical test wafer may look like this:

$\theta = 400 \; ppm = 400 \ast 10^{-6}; \; \Delta X = 1.5 \; mm; \; \Delta Z = 0.6 \; \mu m$ FIG. 4 is an example showing measured focus errors for a particular layer, in accordance with an embodiment of a method of the present invention. FIG. 5 is a focus compensation file derived from the measured errors of FIG. 4, in accordance with one embodiment. These data are used for full wafer pre-compensation of focus and tilt on each field.

The input data file of FIG. 5 results in error correction superior over the currently used average field and +/− error calibration tables. Such calibration tables are typically limited to less than a certain number of variables, for example 50, providing an incomplete solution for error compensation. The methods in accordance with embodiments of the present invention, have inherently much higher number of degrees of freedom, essentially matching the number of degrees of freedom in the entire system and enabling a near-perfect compensation of systematic focus errors for each specific product and each specific layer of the product, as required.

The error correction is estimated over a full (all fields on a wafer) time sequence, defined as data gathered over all the fields, and the error correction is also applied over a full time sequence, limited only by the bandwidths of focus sensor, servo, and stage actuators. The read-out of the focus error and its compensation are made on the congruent domains, the same number of degrees of freedom, so that the compensation corrects for all errors in the system. This contrasts with the current practice of using field focus compensation in which the average focus/tilt and servo error in +/− scan are used in the form of average field and average +/− difference.

The embodiments of the methods in accordance with the present invention provide a densely sampled through scan focus and tilt errors at each exposed field, and a dense through scan dynamic correction for focus and tilt on each field. The printing of a tilted and defocused grating for two points in the field yields a complete description of image focus through scan, an estimate of defocus/variation derived from the lateral displacement of printed image, and accounts for all sources of focus error in image of all exposed fields.

The embodiments of the methods in accordance with the present invention provide error control and correction on each wafer during production, not just on test or diagnostic wafers, in contrast with conventional methods. Conventional methods of reducing focus error require labor intensive and expensive adjustments in tools and materials. The methods of the present invention provide for compensation of all sources of focus imperfection by way of metrology and correction at the point of exposure.

The embodiments of the methods in accordance with the present invention are not limited to single stage systems, but can be utilized on other systems such as a twin-stage system.

The embodiments of the methods in accordance with the present invention provide focus diagnostic and metrology of defocus, including product- and layer-specific errors, as well as tool hardware- and software-specific. The focus errors are measured and used to compensate all of these areas.

The embodiments of the methods in accordance with the present invention can be extended beyond focus control, and can be utilized for, but not limited to, control of dose (effective exposure dose, a factor of the performance of the lithography tool and of the track/process); lithography tool in-plane stage vibration; astigmatic patterning effects; generic test of adhesion failure; generic link qualification for patterning and process variation; reticle/array centration with respect to the wafer edges; blade centration with respect to the pattern on reticle; EBR centration with respect to the wafer edges; claw centration with respect to the wafer edges; among others.

The embodiments of the methods in accordance with the present invention allow for: the relaxation of tolerance specifications; maintaining relaxed shape/focus-related control at all steps of the process up to the "point of use"; the closing of the focus control loop at the point of use as required on each product and layer This new method is forgiving of accrued focus errors in that it accounts and compensates for them.

The embodiments of the methods in accordance with the present invention account for focus errors due to reticle and wafer stage platens, wafer chuck non-flatness/wear and systematic chucking errors, wafer non-parallelism and wafer processing, including CMP, SOG and sputtering.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of process variation compensation in step-and-scan lithography comprising:
   estimating a magnitude of a process error over a full imaged substrate surface; and
   applying error correction during scan exposure over the full imaged substrate surface by adjusting a step and scan system used during said scan exposure to compensate for the process error.

2. The method of claim 1 wherein the full imaged substrate surface comprises one or more exposed fields and wherein estimating a magnitude of a process error comprises:
   exposing a reticle with a predetermined tilt and defocus to produce two bands of remaining resist for two points within slot (slit); and
   using resulting patterns on the surface of the substrate to measure focus variation within the plurality of exposed fields.

3. The method of claim 2 wherein exposing the reticle comprises exposing the reticle using a real product file of a particular layer of a particular product.

4. The method of claim 2 wherein measuring the focus variation comprises
   observing deviations of resist bands from straight; and
   using a formula, $\Delta Z = \Delta X * \theta$, to estimate the focus variation, where $\Delta Z$ is estimated defocus, $\Delta X$ is deviation of a printed resist band from its expected position, and $\theta$ being the user-controlled tilt.

5. The method of claim 1 further comprising compiling a slot (slit) focus and tilt compensation table by using focus deviations at two bands per field produced at two points per slot (slit), enabling slot (slit) defocus and tilt corrections to be made at a time of exposure and wherein applying error correction comprises:
   reversing a direction of observed defocus at two points per slot (slit) over a plurality of scan exposed fields; and
   producing an equivalent amount of slot (slit) tilt and defocus; and applying the produced defocus as a first small additive defocus.

6. The method of claim 5 wherein exposing a reticle comprises: using a test substrate;
   using a standardized track recipe; and
   using a standardized dose, numerical aperture and illumination.

7. The method of claim 6 further comprising: retaining the test substrate;
   measuring topography of the retained test substrate; measuring topography of a retained process substrate; and
   producing a height difference between a height variation of the retained process substrate and the height variation of the retained test substrate.

8. The method of claim 1 wherein applying error correction comprises applying a second small additive defocus equal to produced height difference between the retained process substrate and the retained test substrate.

9. The method of claim 1 wherein estimating process error comprises:
   exposing a blank reticle to sub-Eo dose;
   measuring resist thickness remaining on the plurality of exposed fields; and
   calibrating to produce an effective exposure dose.

10. The method of claim 1 wherein applying error correction comprises reversing a sign of an effective dose variation across slot (slit) through scan, producing an equivalent amount of within-slot dose change through scan and applying a small additive offset to the exposure dose when scan exposing the plurality of exposure fields.

11. The method of claim 1 wherein estimating a process error over a full wafer surface comprises measuring focus and/or effective exposure dose such as using one of a class of process monitors and applying corrections during scanned exposure.

12. The method of claim 1 wherein estimating a magnitude of a process error over a full imaged substrate surface comprises
   metrology of critical dimensions in resist features, etched feature or of the resulting electrical dimensions;
   producing estimates of process variable variation that would have resulted in such variations; and
   applying a negated equivalent amount of dose and focus change when scan-exposing at least one of exposure fields.

* * * * *